United States Patent
Weng et al.

[11] Patent Number: 5,858,861
[45] Date of Patent: Jan. 12, 1999

[54] REDUCING NITRIDE RESIDUE BY CHANGING THE NITRIDE FILM SURFACE PROPERTY

[75] Inventors: Fu-Tien Weng; Chih-Hsiung Lee, both of Hsin-Chu, Taiwan

[73] Assignee: Taiwan Semiconductor Manufacturing Company, Ltd., Hsin-Chu, Taiwan

[21] Appl. No.: 79,525

[22] Filed: May 15, 1998

[51] Int. Cl.$^6$ .............................. H01L 21/30; H01L 21/00
[52] U.S. Cl. ..................... 438/439; 438/750; 438/751; 438/800; 134/2
[58] Field of Search ..................... 438/751, 448, 438/723, 724, 965, 800, 906, 974, 748, 750, 753; 430/159, 161, 302; 134/2

[56] References Cited

U.S. PATENT DOCUMENTS

| | | | |
|---|---|---|---|
| 3,549,365 | 12/1970 | Thomas | 430/159 |
| 5,294,570 | 3/1994 | Fleming et al. | 438/800 |
| 5,454,901 | 10/1995 | Tsuji | 438/750 |
| 5,607,543 | 3/1997 | Eisenberg et al. | 438/751 |
| 5,712,198 | 12/1995 | Shive et al. | 134/2 |

*Primary Examiner*—Charles Bowers
*Assistant Examiner*—David S. Blum
*Attorney, Agent, or Firm*—George O. Saile; Stephen B. Ackerman; Rosemary L. S. Pike

[57] ABSTRACT

A new method of changing the surface property of a nitride film from hydrophobic to hydrophillic and thereby reducing nitride residue after photolithography is described. A pad oxide layer is provided on the surface of a semiconductor substrate. A nitride layer is deposited overlying the pad oxide layer. Thereafter, the surface of the nitride layer is cleaned wherein the surface is changed from hydrophobic to hydrophillic. The nitride layer is coated with a photoresist film which is developed to leave an opening where the field oxidation region is to be formed. The nitride layer and pad oxide layer are etched away where they are not covered by the photoresist film to expose a portion of the semiconductor substrate. The exposed portion of the semiconductor substrate is oxidized to form a field oxidation region in the fabrication of an integrated circuit.

23 Claims, 3 Drawing Sheets

REDUCING NITRIDE RESIDUE BY CHANGING THE NITRIDE FILM SURFACE PROPERTY

BACKGROUND OF THE INVENTION (1). Field of the Invention

The invention relates to a method of reducing nitride residue in the fabrication of integrated circuits, and more particularly, to a method of reducing nitride residue by changing the nitride film surface to a hydrophilic state in the manufacture of integrated circuits.

(2). Description of the Prior Art

In the manufacture of integrated circuit devices, particles and residues on a nitride layer can have serious consequences for the quality of VLSI circuit manufacturing. The residues and particles occurring during nitride deposition and photolithographic developing play a major role in degrading the yield of wafers. It has been observed during after development inspection (ADI) and after etching inspection (AEI) that many tiny particles, discoloration, pattern lifting, and extra patterns have occurred. Pattern lifting will cause loss of field oxide, resulting in decreased wafer yield.

Co-pending U.S. patent application Ser. No. 09/040,434 to C. W. Cho et al filed on Mar. 18, 1998 discloses that cleaning a wafer with $NH_4OH$—$H_2O_2$ (APM), HCl—$H_2O_2$ (HPM), and $H_2SO_4$—$H_2O_2$ (SPM) will leave the surface of the wafer in a hydrophillic state due to the oxidizing nature of peroxide ($H_2O_2$). This is a problem if the surface is a polysilicon film. The invention of Cho et al cleans impurities and residue from a hydrophillic surface.

In the book, *Integrated Circuit Fabrication Technology*, by David J. Elliot, McGraw-Hill Book Company, NY, N.Y., c. 1982, pp. 111–112, the author discusses pre-photoresist cleaning of wafers using a sulfuric acid-hydrogen peroxide solution. U.S. Pat. No. 5,607,543 to Eisenberg et al teaches a hydrofluoric acid (HF) cleaning of a polysilicon layer before deposition of a silicon nitride layer, then HF cleaning of the silicon nitride layer to remove silicon dioxide or oxynitride after field oxidation. U.S. Pat. No. 5,413,670 to Langan et al discloses etching or cleaning of silicon nitride using $NF_3$. U.S. Pat. No. 5,294,570 to Fleming, Jr. et al teaches cleaning a wafer with a strong acid and a small amount of a fluorine-containing compound such as HF. U.S. Pat. No. 5,181,985 to Lampert et al shows a water spray and HF gas can be used to clean a wafer and $O_2$ and HCl gas can be used to make the surface hydrophillic.

SUMMARY OF THE INVENTION

A principal object of the present invention is to provide an effective and very manufacturable method of removing impurities from a wafer surface.

A further object of the invention is to provide a method for removing particles and residue from the nitride surface of a wafer before photolithography.

A still further object of the invention is to provide a method for changing the surface property of a nitride film from hydrophobic to hydrophillic.

Yet another object is to provide a method for changing the surface property of a nitride film from hydrophobic to hydrophillic and thereby reducing nitride residue after photolithography.

In accordance with the objects of this invention a new method of changing the surface property of a nitride film from hydrophobic to hydrophillic and thereby reducing nitride residue after photolithography is achieved. A pad oxide layer is provided on the surface of a semiconductor substrate. A nitride layer is deposited overlying the pad oxide layer. Thereafter, the surface of the nitride layer is cleaned wherein the surface is changed from hydrophobic to hydrophillic. The nitride layer is coated with a photoresist film which is developed to leave an opening where the field oxidation region is to be formed. The nitride layer and pad oxide layer are etched away where they are not covered by the photoresist film to expose a portion of the semiconductor substrate. The exposed portion of the semiconductor substrate is oxidized to form a field oxidation region in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

The inventors have published a paper, "A Study on Nitride Film Surface Properties to Reduce Nitride Residue," by F. T. Weng et al, *Proceedings of the SPIE 23rd Annual International Symposium on Microlithography*, Febuary 1998, which is herein incorporated by reference.

Figure 1:
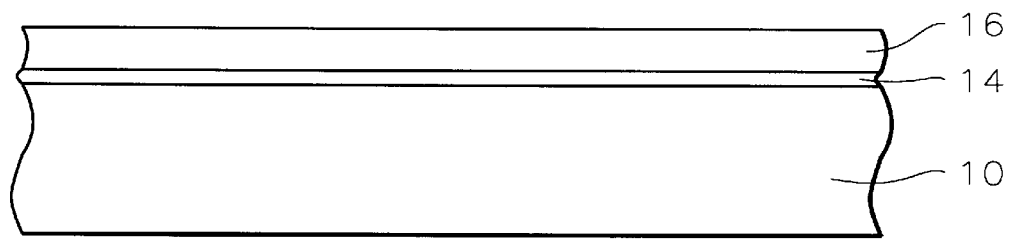
FIGS. 1, 3, 4B, 5, and 6 schematically illustrate in cross-sectional representation a preferred embodiment of the present invention.

Referring now more particularly to FIG. 1, there is illustrated a portion of a partially completed integrated circuit. There is shown a semiconductor substrate 10, preferably composed of monocrystalline silicon. Each active region of the integrated circuit device is to be isolated from other active regions. The first series of steps involves forming these isolation regions. Typically, certain selected surface portions of a silicon semiconductor substrate are masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide (FOX) pattern. Then semiconductor devices can be provided in the silicon mesas.

Typically, silicon nitride is used as the oxidation mask. A layer of pad oxide 14 is first thermally grown on the surface of the substrate to a thickness of between about 350 and 550 Angstroms. Then, a layer of silicon nitride 16 is deposited over the pad oxide layer to a thickness of between about 1450 and 1500 Angstroms.

Particles and residues occurring during the nitride deposition and photoresist development processes deleteriously effect the wafer. Therefore, the process of the present invention adds a cleaning step after the nitride deposition and before the photoresist coating. This cleaning process will both remove particles from the nitride deposition and, most importantly, change the surface state of the nitride film from hydrophobic to hydrophillic.

Figure 2:
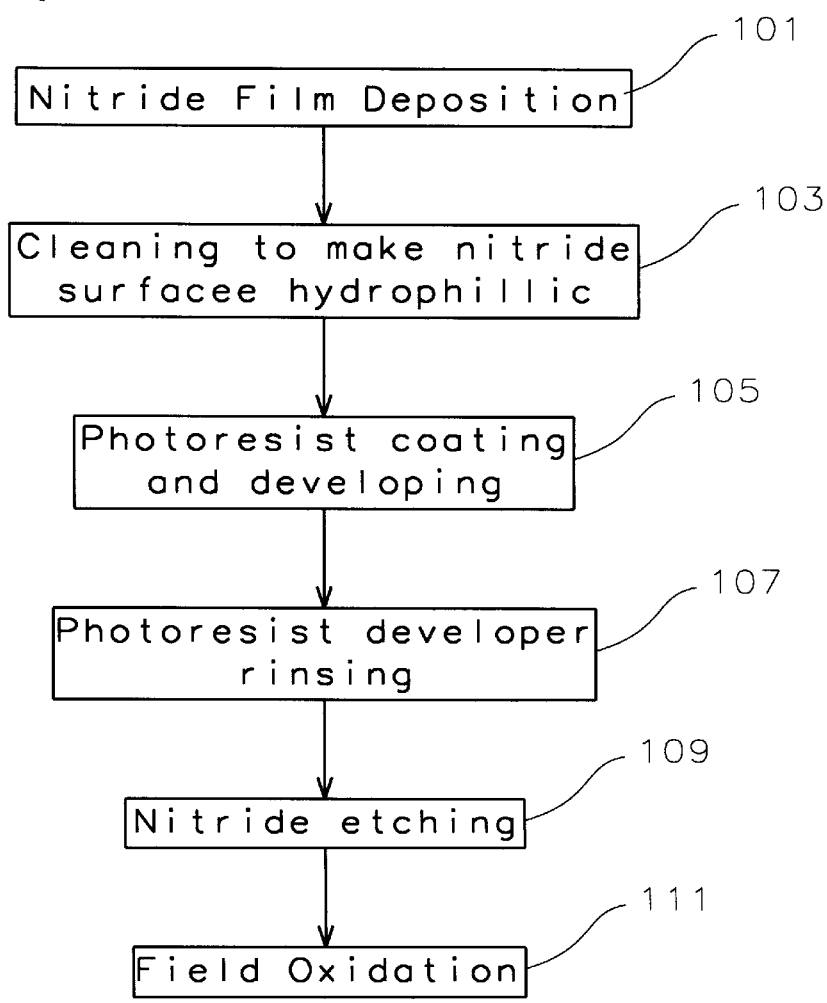
FIG. 2 is a flowchart of the process of the present invention.

FIG. 2 is a flowchart illustrating the steps of the process of the present invention. The key feature of the present invention, cleaning the nitride surface 103, is added after the nitride deposition 101 and before the photoresist coating and developing 105.

The cleaning process of the present invention may include a first step of immersing the wafer in a hydrofluoric (HF) acid solution or HF and $H_2O_2$. Additional solutions including $NH_4OH+H_2O_2$+deionized water and $HCl+H_2O_2$+deionized water may be used.

Figure 3:
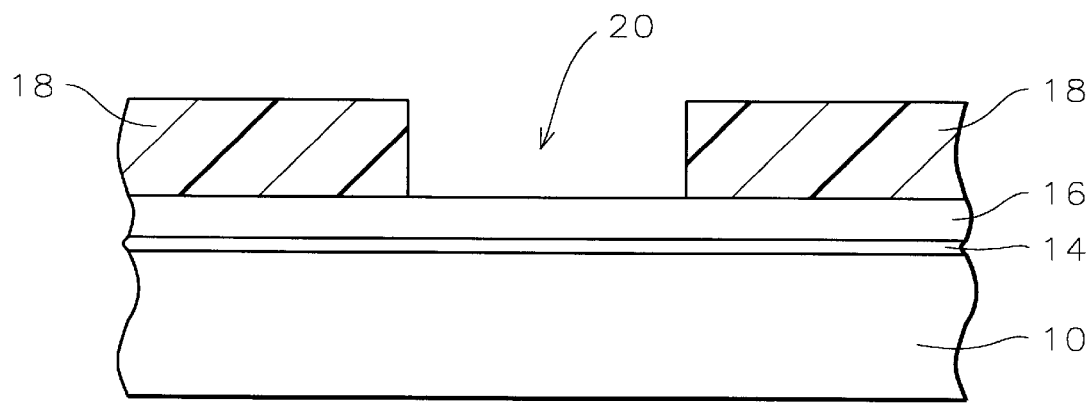

Referring now to FIG. 3, a photoresist layer is coated over the surface of the nitride layer 16 and patterned to form the photoresist mask 18 with an opening 20 where the field oxide region is to be formed. After the photoresist is exposed to light, it is developed and the unwanted photoresist is rinsed away using deionized water.

Figure 4A:
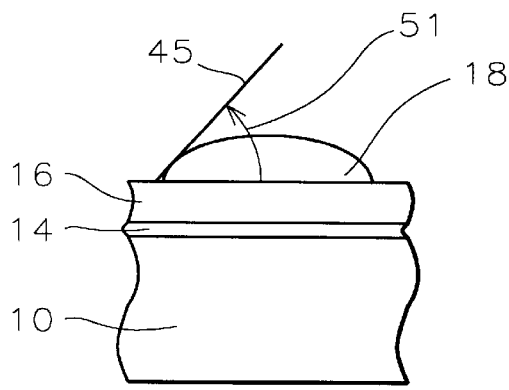
FIGS. 4A and 7 schematically illustrate in cross-sectional representation an embodiment of the prior art.

The inventors have measured the contact angle of the deionized water on different layer films. It has been found that the contact angle of the deionized water on a nitride film surface is large and that the surface is more hydrophobic than other films. The deionized water with a large contact angle, measured at more than 40 degrees, cannot clear away all of the organic liquid, exposed photoresist, and developer mixture on the nitride film. FIG. 4A illustrates photoresist residue 18 to be cleared from the nitride surface by the deionized water. The deionized water 45 contacts the nitride surface 16 at an angle 51 of more than about 40 degrees.

Figure 4B:
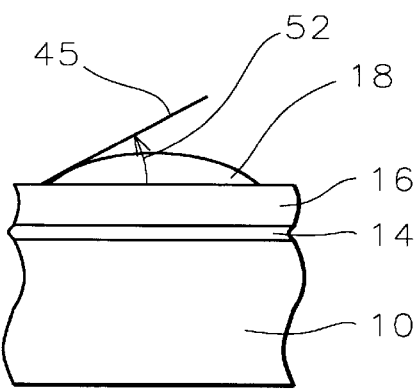

Using the cleaning process of the present invention, the nitride surface is made hydrophillic. Therefore, as illustrated in FIG. 4B, the contact angle 52 of the deionized water 45 is about 4 degrees. The photoresist residue 18 can much more easily be removed if the nitride surface is hydrophillic.

Figure 5:
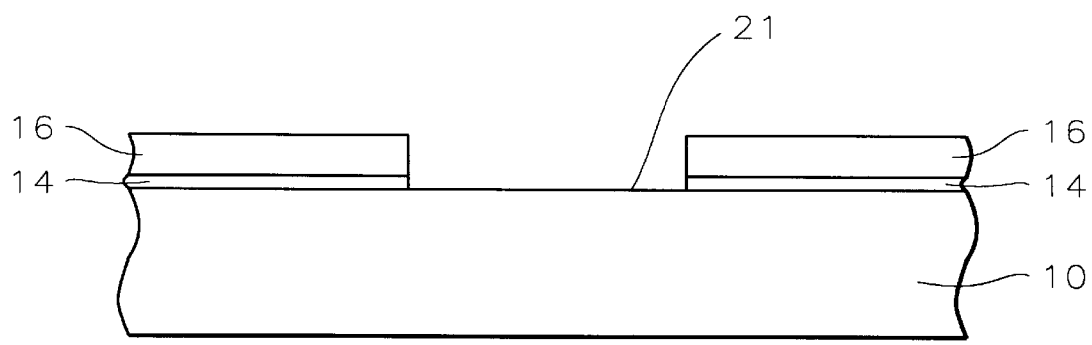

Referring now to FIG. 5, the silicon nitride layer 16 and pad oxide layer 14 are etched away where they are not covered by the photoresist mask. The photoresist mask is removed. Since the nitride surface is hydrophillic, the photoresist mask can more easily be removed with no residue remaining.

Figure 6:
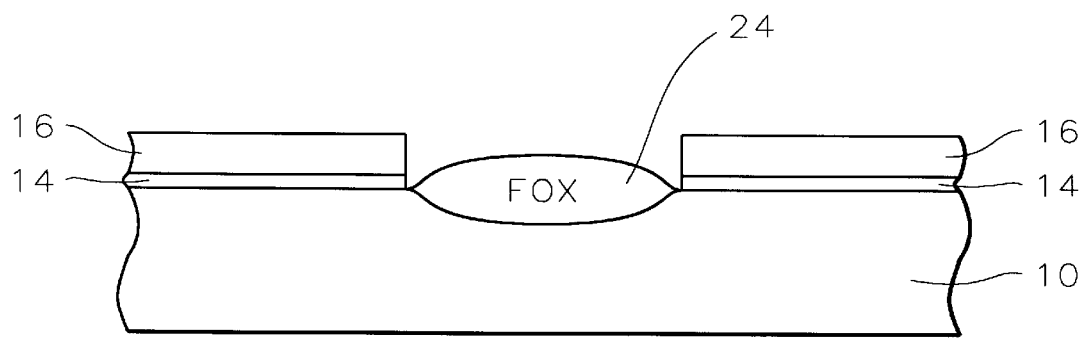
Figure 7:
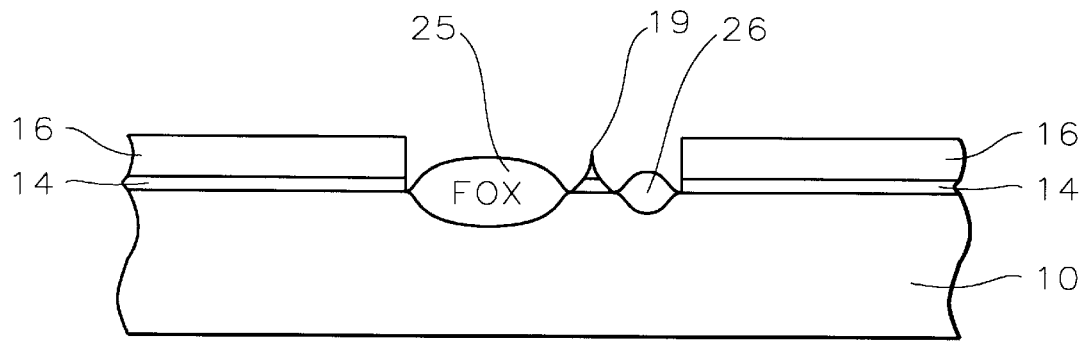

Field oxidation 111 is to be performed next. The exposed surface 21 is oxidized to grow a thermal field oxide region 24, as illustrated in FIG. 6. If the photoresist residue is not completely removed within the opening 20, as shown in FIG. 4A, nitride residue will remain after the nitride etching step 109 because the photoresist residue will mask the underlying nitride. The field oxidation will be incomplete, as shown in FIG. 7. Nitride residue 19 will prevent the formation of a field oxide at that point. Field oxide regions 25 and 26 are formed with a gap between them.

The cleaning process of the present invention results in a reduction of particles and residues so that the field oxidation regions are formed without missing pieces. Furthermore, since the surface of the nitride layer has been made hydrophillic, the deionized water rinse can more completely clear away photoresist and developer solution residues resulting in higher yield.

Figure 8:
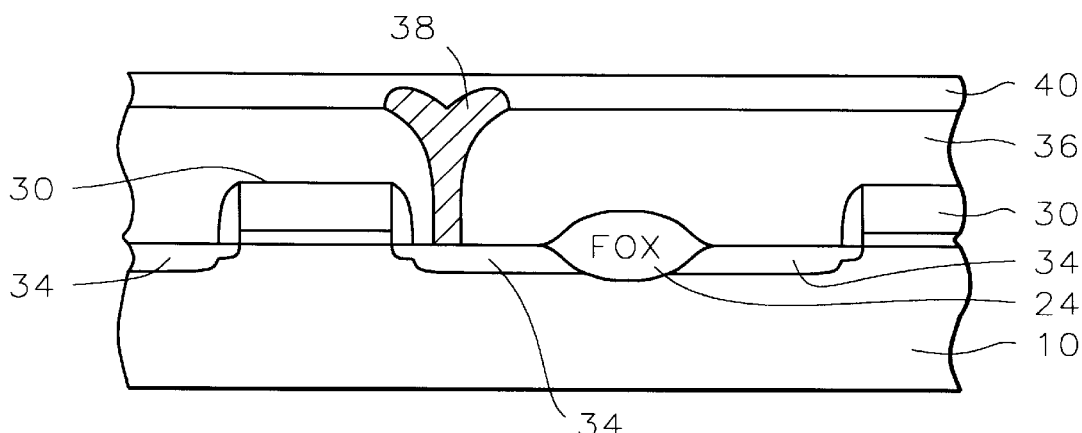
FIG. 8 schematically illustrates in cross-sectional representation a completed integrated circuit device of the present invention.

Processing continues as is conventional in the art. The pad oxide and silicon nitride layers 14 and 16 are removed. Now semiconductor device structures can be fabricated in the active areas. For example, FIG. 8 illustrates gate electrodes 30, source and drain regions 34, a conducting layer 38 contacting one of the source and drain regions through an insulating layer 36 and a passivation layer 40.

The process of the present invention provides a simple and effective method of improving yield by reducing particles and residues occurring during nitride layer processing. Most nitride residues which cause missing field oxide areas can be reduced by adding the cleaning step of the present invention after nitride deposition and before photoresist coating in the field oxidation process. The cleaning step of the present invention changes the nitride surface property from hydrophobic to hydrophillic which causes the deionized water rinse to be much more effective in removing residues.

While the invention has been particularly shown and described with reference to the preferred embodiments thereof, it will be understood by those skilled in the art that various changes in form and details may be made without departing from the spirit and scope of the invention.

What is claimed is:

1. A method of forming a field oxidation region in the fabrication of an integrated circuit on a wafer comprising:

providing a pad oxide layer on the surface of a semiconductor substrate of said wafer;

depositing a nitride layer overlying said pad oxide layer wherein the surface of said nitride layer is hydrophobic;

cleaning the surface of said nitride layer wherein said surface is changed from hydrophobic to hydrophillic;

coating said hydrophillic nitride layer with a photoresist film and developing said photoresist to leave an opening where said field oxidation region is to be formed;

etching away said nitride layer and said pad oxide layer where they are not covered by said photoresist film to expose a portion of said semiconductor substrate; and oxidizing said exposed portion of said semiconductor substrate to form said field oxidation region in the fabrication of said integrated circuit.

2. A method according to claim 1 wherein said nitride layer comprises silicon nitride having a thickness of between about 1450 and 1500 Angstroms.

3. A method according to claim 1 wherein said step of cleaning said surface of said nitride layer comprises immersing said wafer in a hydrofluoric acid solution.

4. A method according to claim 1 wherein said step of cleaning said surface of said nitride layer comprises immersing said wafer in a solution of hydrofluoric acid and $H_2O_2$.

5. A method according to claim 1 wherein said step of cleaning said surface of said nitride layer comprises:

immersing said wafer in a hydrofluoric acid solution; and immersing said wafer in a solution of $NH_4OH$, $H_2O_2$, and de-ionized water.

6. A method according to claim 1 wherein said step of cleaning said surface of said nitride layer comprises:

immersing said wafer in a hydrofluoric acid solution; and immersing said wafer in a solution of HCl, $H_2O_2$, and de-ionized water.

7. A method according to claim 1 wherein said step of cleaning said surface of said nitride layer comprises:

immersing said wafer in a hydrofluoric acid solution;

immersing said wafer in a solution of $NH_4OH$, $H_2O_2$, and de-ionized water; and immersing said wafer in a solution of HCl, $H_2O_2$, and de-ionized water.

8. A method according to claim 1 wherein said step of cleaning said surface of said nitride layer comprises:

immersing said wafer in a solution of $NH_4OH$, $H_2O_2$, and de-ionized water; and immersing said wafer in a solution of HCl, $H_2O_2$, and de-ionized water.

9. A method according to claim 1 wherein said step of developing said photoresist film includes rinsing said surface of said nitride layer within said opening using de-ionized water and wherein the contact angle of said de-ionized water with said nitride layer is more than 40 degrees when said nitride surface is hydrophobic and is about 4 degrees when said nitride surface is hydrophillic.

10. A method according to claim 9 wherein said rinsing said surface of said nitride layer with de-ionized water is more effective when said nitride surface is hydrophillic than when said nitride surface is hydrophobic.

11. A method of forming a field oxidation region in the fabrication of an integrated circuit comprising:

provisioning a pad oxide layer on the surface of a semiconductor substrate;

depositing a nitride layer overlying said pad oxide layer wherein the surface of said nitride layer is hydrophobic;

cleaning the surface of said nitride layer wherein said surface is changed from hydrophobic to hydrophillic;

coating said hydrophillic nitride layer with a photoresist film;

developing said photoresist film to leave an opening where said field oxidation region is to be formed;

rinsing said developed photoresist film away within said opening using de-ionized water;

etching away said nitride layer and said pad oxide layer where they are not covered by said photoresist film to expose a portion of said semiconductor substrate; and oxidizing said exposed portion of said semiconductor substrate to form said field oxidation region in the fabrication of said integrated circuit.

12. A method according to claim 11 wherein said nitride layer comprises silicon nitride having a thickness of between about 1450 and 1500 Angstroms.

13. A method according to claim 11 wherein said step of cleaning said surface of said nitride layer comprises:

immersing said wafer in a hydrofluoric acid solution.

14. A method according to claim 11 wherein said step of cleaning said surface of said nitride layer comprises immersing said wafer in a solution of hydrofluoric acid and $H_2O_2$.

15. A method according to claim 11 wherein said step of cleaning said surface of said nitride layer comprises:

immersing said wafer in a hydrofluoric acid solution; and immersing said wafer in a solution of $NH_4OH$, $H_2O_2$, and de-ionized water.

16. A method according to claim 11 wherein said step of cleaning said surface of said nitride layer comprises:

immersing said wafer in a hydrofluoric acid solution; and immersing said wafer in a solution of HCl, $H_2O_2$, and de-ionized water.

17. A method according to claim 11 wherein said step of cleaning said surface of said nitride layer comprises:

immersing said wafer in a hydrofluoric acid solution;

immersing said wafer in a solution of $NH_4OH$, $H_2O_2$, and de-ionized water; and immersing said wafer in a solution of HCl, $H_2O_2$, and de-ionized water.

18. A method according to claim 11 wherein said step of cleaning said surface of said nitride layer comprises:

immersing said wafer in a solution of $NH_4OH$, $H_2O_2$, and de-ionized water; and immersing said wafer in a solution of HCl, $H_2O_2$, and de-ionized water.

19. A method according to claim 11 wherein in said step of rinsing developed photoresist with de-ionized water, the contact angle of said de-ionized water with said nitride layer is more than 40 degrees when said nitride surface is hydrophobic and is about 4 degrees when said nitride surface is hydrophillic.

20. A method according to claim 11 wherein said step of rinsing developed photoresist with de-ionized water is more effective when said nitride surface is hydrophillic than when said nitride surface is hydrophobic.

21. A method of forming a field oxidation region in the fabrication of an integrated circuit comprising:

providing a pad oxide layer on the surface of a semiconductor substrate;

depositing a nitride layer overlying said pad oxide layer wherein the surface of said nitride layer is hydrophobic;

cleaning the surface of said nitride layer using a solution of $NH_4OH$, $H_2O_2$, and de-ionized water and a solution of HCl, $H_2O_2$, and de-ionized water wherein said surface is changed from hydrophobic to hydrophillic;

coating said hydrophillic nitride layer with a photoresist film;

developing said photoresist film to leave an opening where said field oxidation region is to be formed;

rinsing said developed photoresist film away within said opening using de-ionized water;

etching away said nitride layer and said pad oxide layer where they are not covered by said photoresist film to expose a portion of said semiconductor substrate; and oxidizing said exposed portion of said semiconductor substrate to form said field oxidation region in the fabrication of said integrated circuit.

22. A method according to claim 21 wherein said step of cleaning said surface of said nitride layer further comprises immersing said wafer in a hydrofluoric acid solution.

23. A method according to claim 21 wherein said step of cleaning said surface of said nitride layer further comprises immersing said wafer in a solution of hydrofluoric acid and $H_2O_2$.

* * * * *